(12) United States Patent
Jones

(10) Patent No.: US 7,427,856 B2
(45) Date of Patent: Sep. 23, 2008

(54) CURRENT SENSING APPARATUS

(75) Inventor: Kent Warren Jones, Bristol, TN (US)

(73) Assignee: General Electric Company, Schenectady, NY (US)

( * ) Notice: Subject to any disclaimer, the term of this patent is extended or adjusted under 35 U.S.C. 154(b) by 76 days.

(21) Appl. No.: 11/647,959

(22) Filed: Dec. 29, 2006

(65) Prior Publication Data
US 2008/0157751 A1 Jul. 3, 2008

(51) Int. Cl.
*G01R 15/18* (2006.01)
(52) U.S. Cl. .................................. 324/117 R
(58) Field of Classification Search ............. 324/117 R, 324/117 H, 127, 765, 158.1, 763, 546–547; 327/482, 588, 443, 190, 86, 11, 440; 336/173–182
See application file for complete search history.

(56) References Cited

U.S. PATENT DOCUMENTS

| | | | |
|---|---|---|---|
| 5,684,426 A * | 11/1997 | De Doncker | 327/440 |
| 6,434,715 B1 | 8/2002 | Andersen | 714/39 |
| 6,442,010 B1 | 8/2002 | Kasztenny et al. | 361/63 |
| 6,469,882 B1 | 10/2002 | Tignor | 361/93.1 |
| 6,563,296 B2 * | 5/2003 | Cooke | 324/127 |
| 7,002,440 B2 | 2/2006 | Attarian et al. | 335/18 |

OTHER PUBLICATIONS

IEEE Std C57.13-1993, IEEE Standard Requirements for Instrument Transformers, pp. 1-73; The Institute of Electrical and Electronics Engineers, Inc.; 1994.
http://www.physics.uc.edu/~bortner/labs/Physics%202%20experiments/Electromagnetic%20Induction/Electromagnetic%20Induction%20htm.htm.

* cited by examiner

Primary Examiner—Jermele M. Hollington
Assistant Examiner—Tung X Nguyen
(74) Attorney, Agent, or Firm—Cantor Colburn LLP

(57) ABSTRACT

Disclosed is a current sensing apparatus which includes a first current transformer that, when energized, has a first input current and a first output current, the first output current being less than the first input current, the first current transformer stepping down the current. The current sensing apparatus includes a second current transformer in electrical communication with the first current transformer that, when energized, has a second input current and a second output current, where the second input current is substantially less than the first output current. The second output current being greater than the first output current, the second current transformer stepping up the current. The stepped up second output current is substantially equal to a nominally rated input current of a low voltage device in electrical communication with the second current transformer.

20 Claims, 7 Drawing Sheets

CURRENT SENSING APPARATUS

BACKGROUND

The present invention relates in general to current transformers and, more particularly, to current sensing devices for providing accurate current to meters and protection devices.

Intelligent Electronic Devices (IEDs) are well known. IEDs include, for example, electronic trip units, protective relays, energy meters and power quality meters. By way of example, a protective relay typically is connected to the secondary side of one or more current sensors coupled to a power line. The current sensors provide analog signals indicative of the power line signals to the protective relay. In the case of IEDs, the analog signals are converted by an analog to digital (A/D) converter to digital signals which are processed by a microcontroller. Alternatively, where older equipment is in use, the analog signal is connected to an analog protective device, such as an electromechanical relay or analog meter. In either case, an analog signal of appropriate magnitude and reflecting a proportional signal to a current on a power line is needed for input to the downstream protective device.

One type of current sensor, a current transformer (CT), is designed to provide a current in its secondary winding which is proportional to the current flowing in its primary winding. Current transformers (CTs) are commonly used in metering and protective relaying in the electrical power industry, including mid-voltage industrial applications, where they facilitate the measurement of large currents, often in the presence of high voltages. The current transformer isolates measurement and control circuitry from the high voltages typically present on the circuit being measured.

Current transformers of the industrial scale are typically constructed by passing a single primary turn (either an insulated cable or an uninsulated busbar) through a well-insulated toroidal core wrapped with many turns of wire. The busbar acts as a primary winding and the wire wrapped around the toroidal core acts as the secondary winding. Current transformers are used extensively for measuring current and monitoring the operation of a power system. The current transformer is typically described by its current ratio from primary winding to secondary winding. Common secondary currents are 1 ampere (A) or 5A.

The current transformer's secondary current provides the general function of powering devices such as low voltage relays, IEDs or meters. While current transformer designs vary widely, each must address the requirements of fitting within a given volume of space, such as within a circuit breaker housing (i.e. mid-voltage (600V) industrial switchgear), and providing the desired level of accuracy when sensing the and stepping up current.

Presently, most critical current sensing solutions are provided with large, heavy current transformers. Electronic and fiber sensing options have been available, but not adopted, due to the loss of system reliability from associated additional components. Solutions are not available to interface with existing 5A or 1A IEDs or the like, and compensate for transmission line losses, saturations losses, etc. and line losses caused by the secondary current traveling a long distance to the IED. Input current for IEDs is traditionally 5A but could be, for example, 1A if the IED is specified for 1A input.

While CT designs vary widely, each must address the requirements of fitting within a given volume of space, such as within a circuit breaker housing, and providing the desired level of accuracy when sensing the circuit current. A predetermined maximum core volume is required within the current transformer to ensure that the current transformer does not become magnetically saturated upon the occurrence of overcurrent conditions when used within compact circuit breakers having variable ampere ratings. Alternatively, a predetermined minimum core volume is required to insure that the core will become sufficiently magnetized at the lower steady-state operating current levels.

With regard to limiting CT size, a single iron core current transformer has been used to both sense the circuit current along with providing operational power to the electronic trip unit in higher ampere-rated circuit breakers. To prevent the iron cores from becoming saturated at higher current levels, expensive magnetic steel laminates have been used and the core size increased to allow for overload and short circuit current sensing.

With regard to circuit current sensing, iron core current transformer for providing trip unit operating power and air core current transformer for circuit current sensing have been used. However, the use of two current transformers in each pole of a circuit breaker is not always feasible because of volumetric constraints. While an improved packaging arrangement of a combination iron and air core current transformers are available, the resultant specialized winding and assembly techniques result in a higher cost design. Such an arrangement is still subject to the saturation considerations when high-currents are involved or when volumetric constraints limit the amount of ferromagnetic core material that can be used.

Magnetic cores are employed in conventional circuit breakers, double break rotary circuit breakers, residential circuit breakers, commercial circuit breakers, industrial circuit breakers, air circuit breakers, overload relays, power meters, or any similar device providing electric circuit protection. Applications involving magnetic cores in circuit protective devices include, but are not limited to, the utility, industrial, and commercial industries. An illustration of prior art is shown in FIG. 1, where a CT having a primary winding comprising mid-voltage industrial busbar and a secondary winding providing secondary current output to an IED (such as a protective relay) located a great distance from the CT for use as operating current and trip current. The distance between the CT secondary winding and the IED factors into greater line losses which are a function of $I^2R$. A single phase circuit is shown (for ease of illustration) whereas typically electric power distributions systems, such as mid-level industrial systems, are three phase and operating at a voltage of, for example 600V. The current transformer 97 of FIG. 1 is large, requiring more area in a switchgear frame and is rated for step-down current large enough in magnitude to operate the IED connected down line (typically rated 5A). The greater step-down current requires more windings than a current transformer with relatively less step-down current and hence the current transformer secondary has more windings than a current transformer with a larger secondary current; hence the current transformer heavier and occupies a greater volume. For example, the prior art CT, such as a Model 785 current transformer manufactured by Instrument Transformers Inc., a division of GE Mutlin, a subsidiary of the assignee of the present invention, weighs 58 lbs. for a single CT or 174 lbs. for three CTs (three-phases). The rating, size, and weight can be determined by one of ordinary skill in the art.

Therefore, based at least on the foregoing summarized discussion, a need exists for a current sensing device that reduces the need to compensate for losses. This novel, current sensing device includes several unique capabilities, including, as non-limiting examples: (1) the ability to provide current to a device without worrying about losses; (2) the ability to fit in smaller spaces; (3) the ability to be specified with lesser weight and hence decrease shipping cost; (4) the ability to sense current accurately; and (5) the ability to sense current and conserve energy. In one embodiment, the current sensing apparatus fits in a switchgear cabinet and is capable of providing current to a down stream device accurately, without the need for tedious, time consuming and often inaccurate loss calculations.

BRIEF DESCRIPTION OF THE INVENTION

The current sensing apparatus of the present invention (also known as the Current sensor system or Cascade Sensor System (CSS)) is a lightweight alternative to a traditional current transformer (CT) that provide signals to low voltage devices such as meters and a wide range protection applications. As in all electrical systems there is line loss associated with current flow in electric lines. The Current Sensing Apparatus transmits a substantially accurate low level current signal from a first current transformer (mounted in, for example, mid-level 600V industrial switchgear frame) which steps the current down for travel over a long electric line of distance D; the step down minimizes line losses over the long line. The long electric line then connects to a smaller step-up unit, or second current transformer, mounted in proximity to a low voltage device such as an IED, meter or analog relay/protective device. The step-up unit provides, for example 5A electric signal to metering or protection applications; 5A is a traditional nominal rating for IEDs and the like in the United States. The 5A signal sees very little transmission line losses due to its proximity, over distance d, to the low voltage device, so a user does not need to specify burdens and relay class voltage when specifying the Current Sensing Apparatus for the application. The Current Sensing Apparatus is compatible with existing low voltage devices, such as IEDs, relays and meters. The Current Sensing Apparatus eliminates the need to perform numerous intricate, time-consuming calculations of the prior art to determine the power capacity including loss compensating calculations (i.e. excitation current and line loss) for a current transformer to perform in a specific installation.

Primary current, at utilization levels, is sensed by an induction current transformer or first current transformer with enough windings to yield a proportional secondary current signal much smaller than the traditional 5A nominal level that is typically specified for low voltage products, such as products powered by the 5A signal. This smaller signal is transmitted over lengthy electric lines much more efficiently than the traditional 5A signal. Further, the increased numbers of turns in the current sensing devices provide a sufficient voltage level. At a point just prior to a low voltage device such as a meter or relay point, the small signal is transformed by a second current transformer to a larger signal, typically a 5A signal to match the 5A input rating of the low voltage device. An important factor is that the small signal travels a comparatively short distance, d, with a comparatively smaller impedance and a comparatively smaller secondary winding resistance. This reduces the possibility of line loss and losses in the current transformer. Hence the apparatus of the present invention is used to obtain a small signal current for operating a low voltage device, where the small signal current is substantially proportional to a large primary current.

The CSS is lighter than traditional CTs. This will save shipping and mounting support costs. The CSS is smaller than traditional CTs. This will save mounting space that must be allocated to current sensing. It is easier to specify the CSS product than a traditional CT product because all CSS systems will meet 0.3% accuracy per IEEE C57.13 for metering, and will operate up to 20 times nominal rating for short bursts for relay over current sensing. Calculations and careful specification must be done with traditional products to insure this performance. In empirical testing, accuracy and voltage were measured to verify performance for metering and relaying. Preliminary results of empirical testing showed cost savings in the range of 11% to 36% and weight reduction in the range of 63% to 84%.

Current is sensed by cascading induction transformers for the purpose of accuracy and energy conservation. Previous attempts to use small signal sensing did not attempt to raise the current back to the traditional 5 ampere basis for meter and relay interface.

Due to the size and weight benefits, and not having to move away from the traditional 5 ampere basis, the alternative should look attractive to some customers. The simplification of specification and the opportunity of standardization will be attractive to some users.

The above brief description sets forth rather broadly the more important features of the present invention in order that the detailed description thereof that follows may be better understood, and in order that the present contributions to the art may be better appreciated. There are, of course, additional features of the invention that will be described hereinafter and which will be for the subject matter of the claims appended hereto.

In this respect, before explaining several preferred embodiments of the invention in detail, it is understood that the invention is not limited in its application to the details of the construction and to the arrangements of the components set forth in the following description or illustrated in the drawings. The invention is capable of other embodiments and of being practiced and carried out in various ways. Also, it is to be understood, that the phraseology and terminology employed herein are for the purpose of description and should not be regarded as limiting.

As such, those skilled in the art will appreciate that the conception, upon which disclosure is based, may readily be utilized as a basis for designing other structures, methods, and systems for carrying out the several purposes of the present invention. It is important, therefore, that the claims be regarded as including such equivalent constructions insofar as they do not depart from the spirit and scope of the present invention.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. Accordingly, the Abstract is neither intended to define the invention or the application, which only is measured by the claims, nor is it intended to be limiting as to the scope of the invention in any way.

This invention overcomes the disadvantages of the prior art by providing smaller, lighter, and less expensive current sensing apparatus CTs. The invention further overcomes the disadvantages of the prior art by providing self protection in that it is internally voltage limited for open circuit protection. The invention further overcomes the disadvantages of the prior art by operates over very long distances between sensors and connected devices without the need for tedious, time consuming, and sometimes inaccurate loss compensating calculations. The invention further overcomes the disadvantages of the prior art by providing energy savings. The invention further overcomes the disadvantages of the prior art because it is lightweight and dimensionally smaller and therefore physically able to fit in spaces unavailable for use with the prior art. The invention further overcomes the disadvantages of the prior art because more sensors can exist in the same space or the space allocated for the invention can be decreased. The invention further overcomes the disadvantages of the prior art because it can be shipped less expensively due to weight and physical size reductions.

The present invention does not require external control power. The present invention is easier to specify to a range of applications due to 0.3% accuracy. The invention does not need the inconvenience of fussing with relay class specification due to the range or protection to at least 20×. This reduces the need for a connection to a traditional power supply. The present invention does not require special re-education and training for users of prior art devices. The invention does not require change out of connected devices due to compatibility with existing devices such as relays and meters. The invention does not require support mechanisms used with traditional, heavier CTs, which is a cost savings.

Recapitulating, disclosed is a current sensing apparatus which includes a first current transformer that, when energized, has a first input current and a first output current, the first output current being less than the first input current, the first current transformer stepping down the current. The current sensing apparatus includes a second current transformer in electrical communication with the first current transformer that, when energized, has a second input current and a second output current, where the second input current is substantially less than the first output current. The second output current being greater than the first output current, the second current transformer stepping up the current. The stepped up second output current is substantially equal to a nominally rated input current of a low voltage device in electrical communication with the second current transformer.

Other advantages of the invention will be obvious and will in part be apparent in part from the specification. The aforementioned advantages are illustrative of the advantages of the various embodiments of the present invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings. The accompanying drawings, which are incorporated in and constitute a part of the specification, illustrate a presently preferred embodiment of the invention, and together with the general description given above and the detailed description of the preferred embodiment given below, serve to explain the principles of the invention, wherein.

DETAILED DESCRIPTION OF THE PREFERRED EMBODIMENTS

Figure 1:
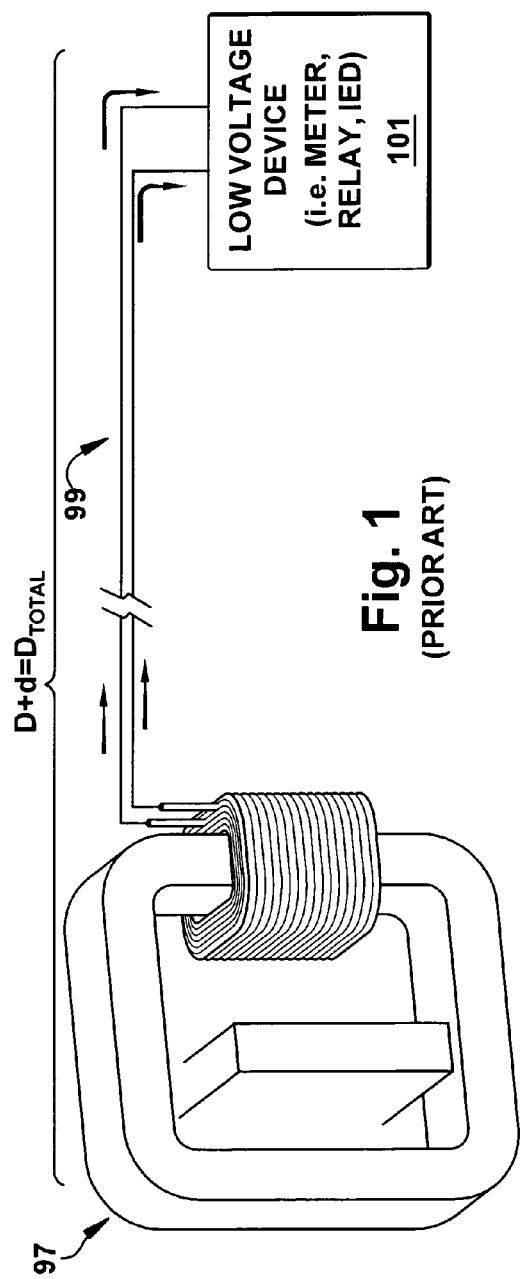
FIG. 1 illustrates a schematic block diagram of a prior art current sensing apparatus supplying current to a device.

In describing present invention, reference will be made herein to FIGS. 1-10 of the drawings in which like numerals refer to like features of the present invention. Referring now to the drawings, wherein like reference numerals designate identical or corresponding parts throughout the several views, one of the embodiments of the current sensing apparatus of the invention will be described. One of the advantageous aspects of an embodiment of the invention described here is a novel current sensing apparatus that smaller, lighter, and less expensive than previous current sensing apparatus while it is also accurate and conserves energy.

Figure 2:
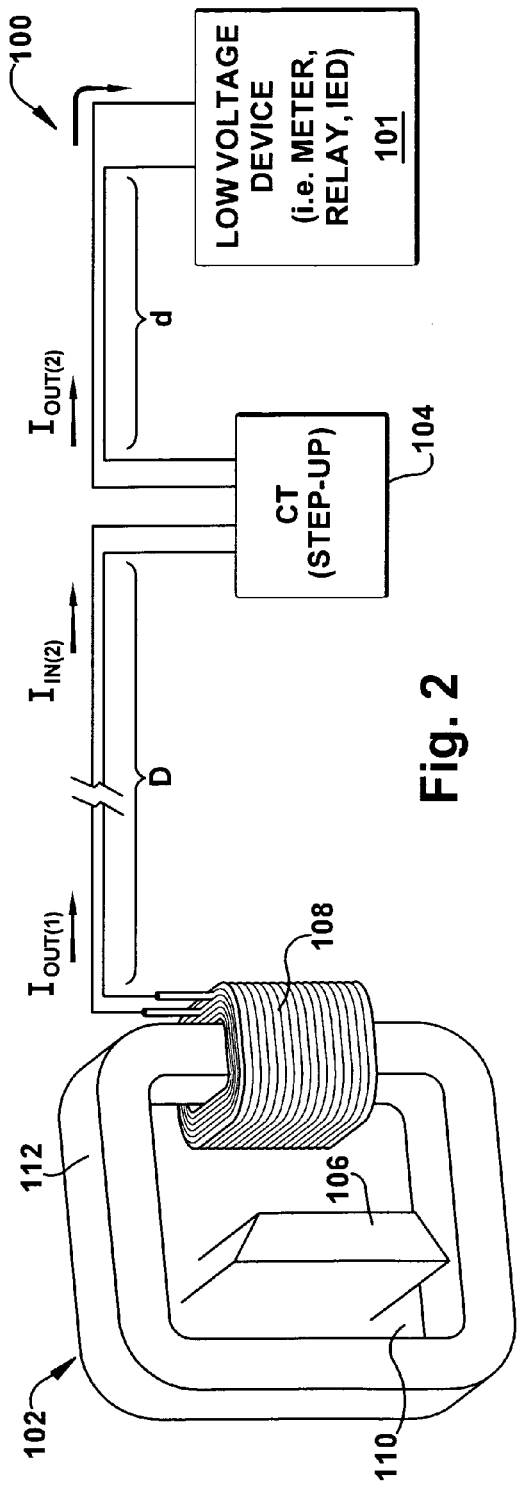
FIG. 2 illustrates a schematic block diagram of a current sensing apparatus of one embodiment of the present invention, supplying current to a device.

FIG. 2 illustrates a schematic block diagram of a current sensing apparatus 100 (also known as the current sensor system or Cascade Sensor System (CSS) of one embodiment of the present invention, supplying current to a device 101. The term "cascade" generally means "something arranged or occurring in a series or in a succession of stages so that each stage derives from or acts upon the product of the preceding" and is used to generally describe the interconnection of current transformers in the present invention; however the term is not meant to be used to interpret the physical connection of the transformers which in some embodiments may be more complex, especially in three-phase embodiments.

The current sensing apparatus comprises a first current transformer 102 and a second current transformer 104. The first current transformer 102 is configured to step-down the line current $I_{in(1)}$ (also referred to herein as the primary current $I_{in(1)}$ of the first current transformer since for the sake of example, losses due to CT saturation are ignored). The second current transformer 104 is configured to step-up the current $I_{in(2)}$. A long distance D, or length of conductor, is present between the first and second current transformers 102, 104; the long distance causes line losses substantially equivalent to $I^2R$ (where I is the current in the line and R is the resistance or impedance of the conductor) so that the first current transformer 102 output current $I_{out(1)}$ is not equal to the second current transformer 104 input current $I_{in(2)}$. A much shorter distance d, or length of conductor, is present between the second current transformer 104 and a down stream low voltage device 101, such as, an electronic relay. Other examples of device 101 were provided supra. The ratio of distances D:d is great and would be known to one of ordinary skill in the art where D>d. Since distance d is a short length, there are substantially no line losses, again eliminating the need for complex time consuming calculations when specifying and setting or programming devices such as, device 101.

It should be noted that the current transformer's secondary current provides the general functions of sensing the circuit current of a protected circuit, and powering the electronics within, for example, a circuit breaker trip unit. While current transformer designs vary widely, each must address the requirements of fitting within a given volume of space, such as within a circuit breaker housing (i.e. mid-voltage industrial switchgear), and providing the desired level of accuracy when sensing the circuit current.

In the case of FIG. 2, again, ignoring losses such as saturation or excitation losses, the primary or input current $I_{in(1)}$ for the first current transformer 102 is provided by a current flowing on busbar 106. While busbar 106 is shown, for example, other primary conductors, as well as differently configured current transformers, may be used in the present invention and can be designated by one of ordinary skill in the art. Returning to the example embodiment of FIG. 2, the busbar 106 passes through an opening 110 formed by the core 112 of the first current transformer 102 and configured to accommodate a busbar 106 of a size suitable for a particular application. In this example, the application is a mid-level (a.k.a. medium level) industrial application such as a large manufacturing facility for which power is provided at a level of for example, 600V. A secondary current or output current $I_{out(1)}$ is induced in the secondary winding 108.

Figure 3:
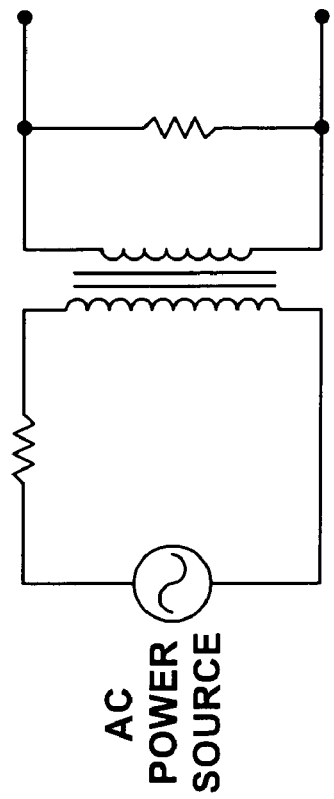
FIG. 3 illustrates an electrical schematic of an exemplary first current transformer of the current sensing apparatus of FIG. 2.
Figure 6:
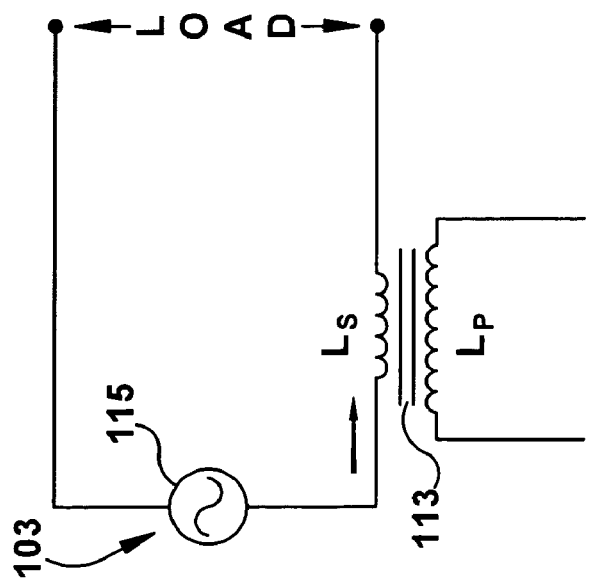
FIG. 6 illustrates an electrical schematic of a voltage transformer at which the first current transformer of the current sensing apparatus of one embodiment of the present invention, such as the embodiment of FIG. 5, is mounted at a transformer bushing.

FIG. 3 illustrates an electrical schematic of an exemplary current transformer 103 of the current sensing apparatus 100 of FIG. 2. The current transformer 103 is illustrated as an iron core 113 current transformer and can be used for first current transformer 102. However, other suitable current transformers may be used as can be determined by one of ordinary skill in the art. Other types of current transformers include, but are not limited to, two-part, Δ-configuration, air gap, single phase, three phase, tapped and adjustable. The core of the first current transformer 102 of FIG. 2 corresponds to the iron core 113 of the current transformer schematic of FIG. 3. The number of coils, $L_{pri}$, $L_{sec}$ illustrated on the primary and secondary sides of the schematic of FIG. 3 is not indicative of any particular ratio $L_{pri}$, $L_{sec}$ that would be used in an embodiment of the current sensing apparatus 100 of the present invention and is provided for exemplary purposes only. Each of the primary and secondary current transformers 102, 104 has a primary and secondary coil configuration so as to provide the appropriate current at an appropriate voltage level to the device 101. The coil configuration can be designated by one of ordinary skill in the art. One particular model that may be used for the first current transformer 102 of an embodiment of the present invention is Model 778 half-width current transformer manufactured by Instrument Transformers Inc., a division of GE Mutlin, a subsidiary of the assignee of the present invention, weighs 11 lbs. for a single CT or 33 lbs. for three-phases. The rating, size, weight can be determined by one of ordinary skill in the art.

Also, an AC power source 115 is illustrated with AC input and output currents $I_{in}$, $I_{out}$; however, the invention is not limited to AC applications, although it would most likely be used in AC applications since typical large power sources are AC rather than DC. For purposes of simplification of describing examples of embodiments of the present invention, all example embodiments herein are described assuming an AC power source 115, such as 600 Volts AC, and hence an AC input current $I_{in(1)}$ to the first current transformer 102. Losses would be different in a DC sourced example and could be determined by one of ordinary skill in the art; therefore, DC losses are not discussed herein. It should be noted that the second current transformer 104, of the current sensing apparatus 100, could be schematically represented by an iron core current transformer such as the exemplary current transformer 103 of FIG. 3. However, the second current transformer 104 is smaller and lighter weight, relatively, as compared to the first current transformer 102. Additionally, since the current sensing apparatus of the present invention comprises a first current transformer 102 and a second current transformer 104, the first current transformer can be substantially smaller and lighter than the current transformer of the prior art (Illustrated in FIG. 1) and for example, could weigh 11 lbs for a single phase or 33 lbs for three phases, as described supra., which is much less than the 58 lb single phase, 174 lb three phase current transformer of the prior art, also described supra.

Figure 4:
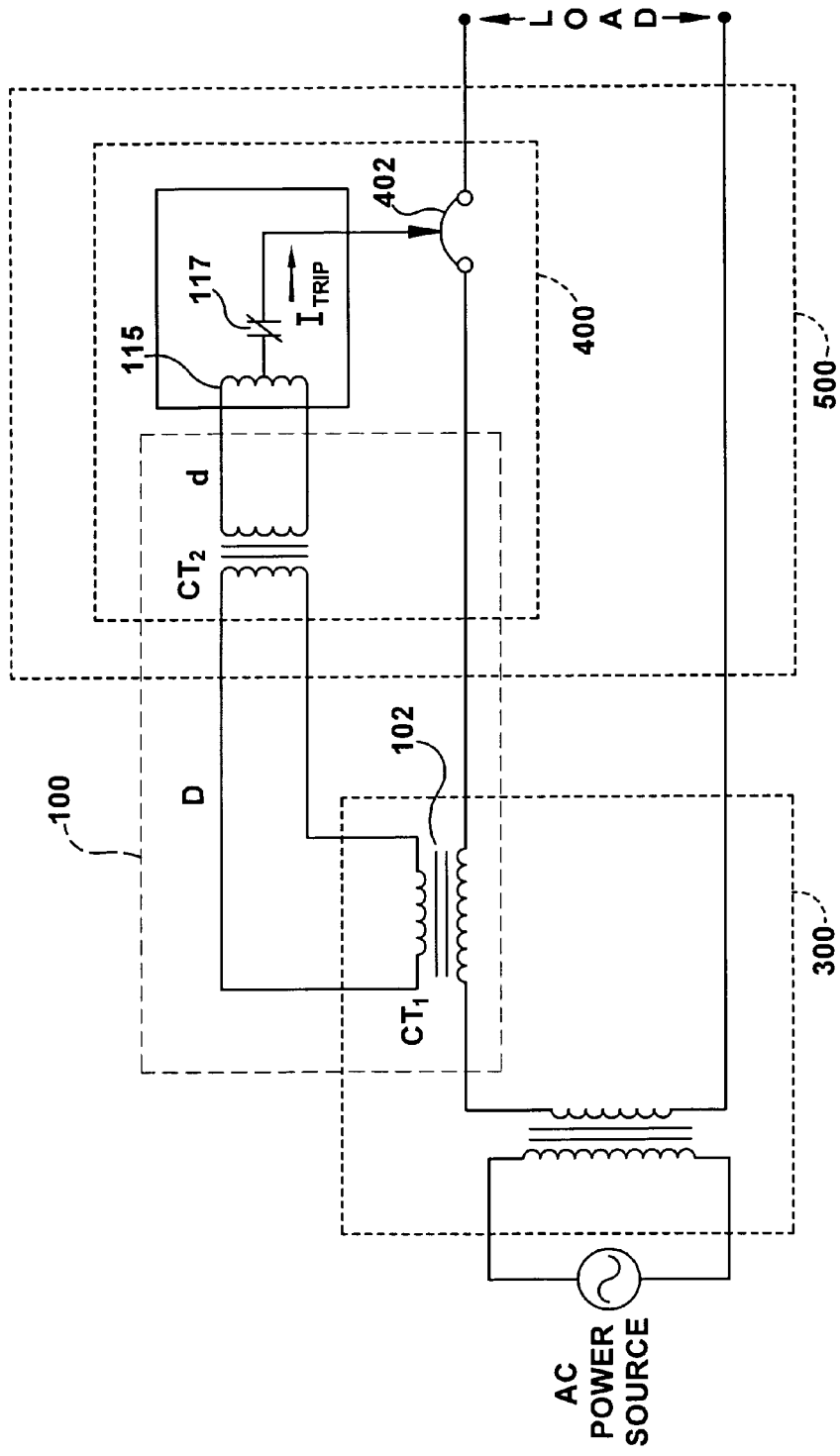
FIG. 4 illustrates an electrical schematic of one embodiment of the present invention connected to a power system and utilizing a current transformer mounted at a transformer bushing for obtaining current from that point and providing the current to a relay and illustrating a connection for tripping a circuit breaker.

FIG. 4 illustrates an electrical schematic of one embodiment of the present invention 100, connected to a power source 200 and utilizing a current transformer (for example a bushing mounted current transformer mounted at the voltage transformer 300 bushing (not shown). The bushing mounted current transformer, is also, for the purposes of describing the present invention, referred to as the first current transformer 102; the first current transformer 102 obtains a primary current at it's mounting point and provides a stepped-down, substantially proportional (theoretically, ignoring losses) secondary current to a second current transformer 104 over a distance D. The second current transformer 104, for the purposes of this embodiment of the present invention, is a step-up transformer and provides a stepped up current to the device 101 at the device's nominal rating, under normal operating conditions; In the United States, the typical nominal rating of a relay or IED is 5A by convention. So, for example during over-current fault conditions (i.e. a line-to-line fault), the current would be more than 5A and the device would be set to operate at a predetermined current level above the nominal operating level of 5A. The predetermined level can be provided by one of ordinary skill in the art. FIG. 4 further illustrates in block/flow diagram format that the device 101 is connected to trip switchgear 402 (also referred to as a circuit breaker). FIG. 4 illustrates a single phase for purposes of simplification; however one of ordinary skill in the art would understand the implementation with more than one phase.

Continuing with the embodiment of FIG. 4, the present invention, in addition to being connected to a power source 200 such as an electric utility or a local generation plant, is also connected to a device 101 such as a relay or other suitable device such as a metering or protective device. The device 101 is located in a local electrical facility such as a switchgear room or electrical facility 500 of a medium voltage industrial plant (not shown). In a medium voltage industrial facility, the switchgear for primary power feeders is sizable. In the present illustration, switchgear 402 is mounted inside a cabinet 400 with a front panel (not shown). The cabinet 400 houses the second current transformer 104. The device 101 is mounted, for example, on a nearby control panel (not shown). The second current transformer 104 is located a distance d from the device 101. The switchgear 402 can alternately be housed in a cabinet, rack or other suitable configuration as may be determined by one of ordinary skill of the art. The device 101 and second current transformer 104 can alternately be mounted on an alternate substrate as may be determined by one of ordinary skill in the art. In the case of electro-mechanical relays, it is most suitable to locate the device on a substrate that will not be moved, banged etc., so as to avoid false operation of the device. The device 101 comprises an operating coil 116 which when charged provides a current $I_{trip}$. When the current $I_{trip}$ reaches a predetermined level, the normally open relay contact 117 closes. The closed contact 117 completes a trip circuit between the device 101 and switchgear 402 operating mechanism (not shown) and allows the switchgear operating mechanism to open the switchgear 402. When the switchgear 402 opens or trips thus disconnecting the power source 200 from the load L. The predetermined trip current $I_{trip}$ level may be determined by one of ordinary skill in the art.

The current sensing apparatus 100 is configured in FIG. 4 such that the first current transformer 102, a step-down transformer, is positioned at the switchgear bushing and the second current transformer 104, a step-up transformer is located on the switchgear panel.

Figure 5:
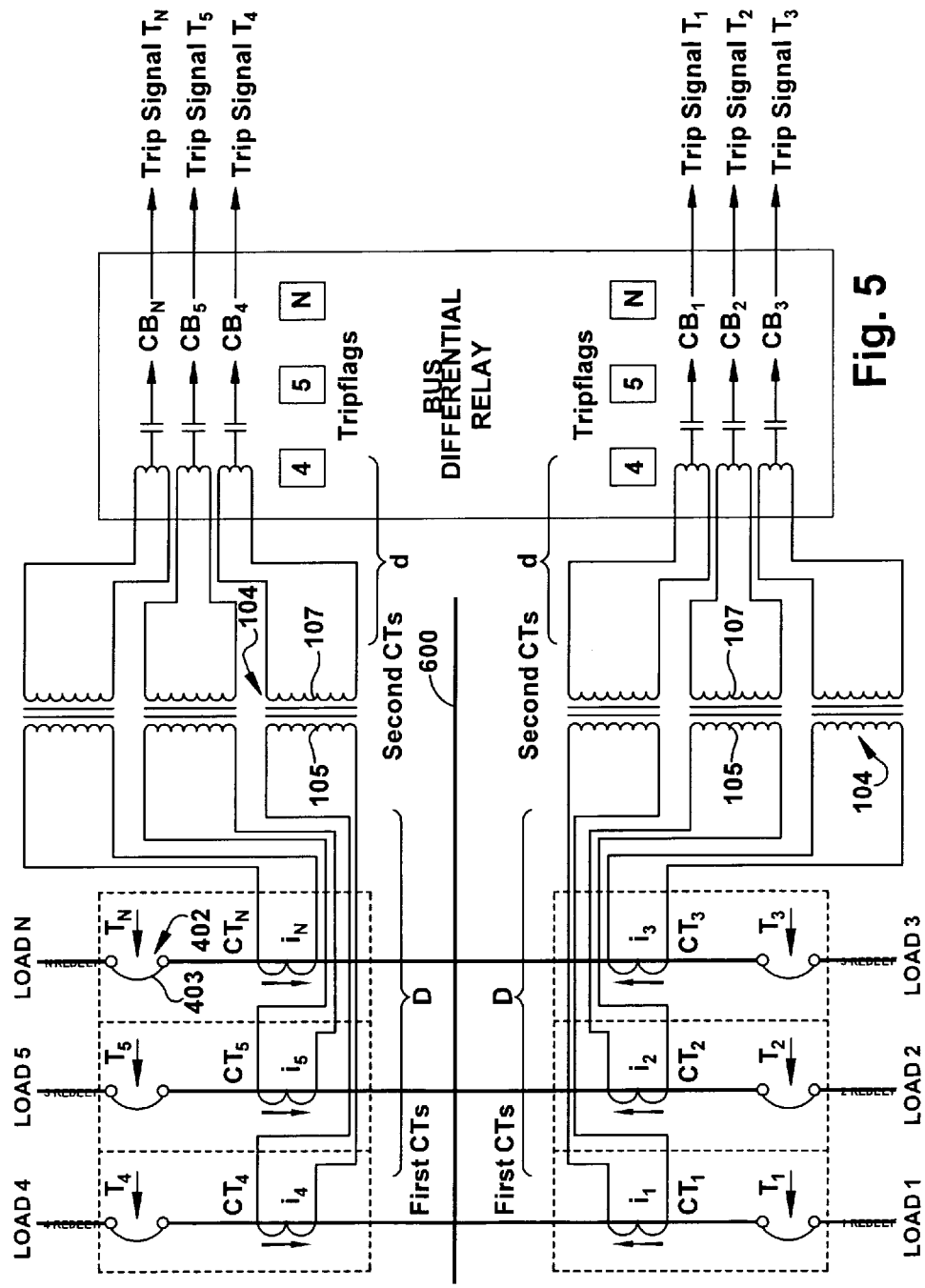
FIG. 5 illustrates an electrical schematic of a current sensing apparatus of one embodiment of the present invention, utilizing a busbar mounted current transformer in a switchgear rack to supply current from that point to a relay and illustrating a connection for tripping a circuit breaker.

FIG. 5 illustrates an electrical schematic comprising another embodiment of the apparatus of the present invention. The schematic illustrates multiple (1 through N, also represented as the notation 1-N) feeders 602 connected to busbar 600 and wherein the busbar 600 is connected to a power source (not shown). Each feeder 602 can be disconnected from the power source it's corresponding (1-N) switchgear 402 connected which has a serial switch 403 in the feeder 602 circuit. Additionally, each switchgear 402 disconnects its associated load from the power source for the feeder 602. At each switchgear 402, a first current transformer 102 is connected in a configuration wherein busbar 600 is the primary current source for first current transformer 102 of the current sensing apparatus 100 of this embodiment of the present invention. The feeder 602 comprises a busbar type conductor at the point of connection to the busbar 600; typically, further away from the busbar 600, closer to the load side, the feeder conductor transitions to a more flexible conductor.

For each feeder of FIG. 5, the busbar 600 induces a current in the secondary winding 108 of the primary current transformer 102 associated with the feeder 602, as is explained supra. in the description of the first current transformer 102 of FIG. 2. The secondary winding 108 of the first current transformer 102 is connected to a corresponding second current transformer 104 at the primary winding 105 (illustrated in FIG. 5) of the second current transformer 104. The second current transformer 104 is connected to a device 101 at it secondary winding 107 (illustrated in FIG. 5). In the example of FIG. 5, the device 101 is a Bus Differential Relay.

The first current transformer 102 obtains a primary current at its mounting point inside the circuit breaker panel and provides a step-down, substantially proportional (theoretically, ignoring losses) secondary current to a second current transformer 104 over a distance D. The second current transformer 104 obtains a primary current from the secondary side of the first current transformer 102. The second current transformer 104 steps-up the current to at least 5A at the output of the secondary side of the second current transformer. The current output of the second current transformer travels a distance d to the device 101. The distance D>d. The greater distance D causes line losses that are typically compensated for at the relay device 101, for example, when the device is set, by providing settings that have been determined by time-consuming, complicated calculations and modeling performed by one of ordinary skill in the art. Note that the current sensing apparatus 100 operates with very long distances between the first current transformer 102 and connected device(s) 101.

In the embodiment of FIG. 5, each first current transformer 102 is mounted in a corresponding switchgear cabinet on the busbar 600 side of the first current transformer 102 of feeder 602 and is electrically connected to a corresponding second current transformer 104 over a distance D of conductor. The corresponding second current transformer 104 is connected on its secondary side to a bus differential relay 101 over a distance d of conductor. The current transformer mounted in the switchgear cabinet, is for example, a half-depth, medium voltage current transformer which takes up less space and weighs less than the larger current transformers used in the prior art.

The industrial mid-voltage power system busbar 600 of FIG. 5 comprises an array of electrical nodes that interconnects a plurality of circuits such as the feeders 602 which can be distribution lines to industrial load and connection to generation source(s) (not shown).

Hence, the busbar 600 of FIG. 5 is connected to a number of energy sources that all together can produce enormous fault current in the event of a short circuit on the busbar (an internal fault for the busbar relay) or one or more feeder 602 connections to the busbar 600 or in a near vicinity of the busbar 600 (an external fault for the busbar relay 101).

With respect to fault currents in the bus differential relay 101 zone of FIG. 5, a large magnitude fault current imposes demanding requirements on the speed of operation of the busbar differential relay 101. At the same time, large currents associated with near external faults may saturate one or more of the first current transformers 102 causing problems for the busbar protective relay due to saturation losses. The busbar 600 can be protected from internal faults by detecting faults internal to the protected busbar 600 and initiating trip command to one or more appropriate switchgears 402. The switchgears 402 subsequently disconnect the defective busbar 600 from all the connected feeders 602 in order to minimize damage to the involved electrical equipment (i.e. circuit breakers, conductors, relays, transformers) and the power system.

Busbar 600 protection is typically accomplished using a differential protection principle. With reference to FIG. 5, the first current transformers are used to measure the currents $I_1$ through $I_N$ in all the feeder 602 circuits connected to the busbar 600. The locations of each of the first current transformers 102 define a "zone" of protection for the busbar 600. The bus differential relay 101 then compares the currents and the unbalance (or differential) current is produced by the bus differential relay 101 as an algebraic sum of all the input currents. In an ideal operation of the first current transformers 102, the differential signal equals zero during typical non-fault load conditions and external faults, while the differential signal equals the fault current during internal faults; a threshold enables the relay to distinguish between internal and external faults in substantially ideal circumstances. The threshold is determined by one of ordinary skill in the art.

Figure 7:
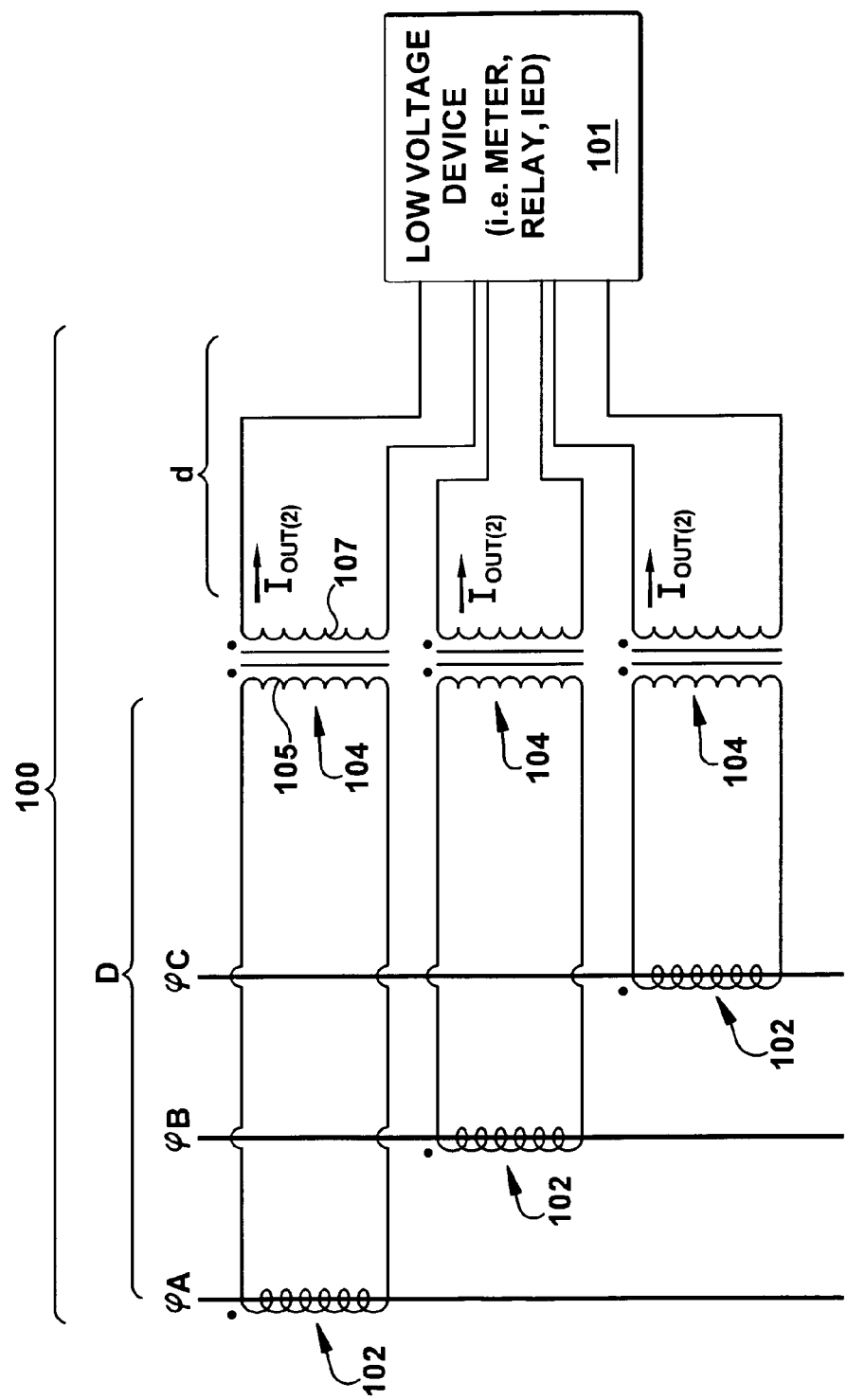
FIG. 7 illustrates an electrical schematic of a current sensing apparatus of one embodiment of the present invention, with 6 low current output signals to the low voltage device, i.e. relay, meter, connected to the current sensing apparatus.

FIG. 7 illustrates an electrical schematic of a current sensing apparatus 100 of one embodiment of the present invention, with 6 low current output signals $I_{out(2)}$ from the second current transformer 104 to the low voltage device 101, i.e. relay or meter, connected to the current sensing apparatus 100. FIG. 7 illustrates a three phase ($\phi A$, $\phi B$, $\phi C$) schematic of the current sensing apparatus 100 of the present invention. A first current transformer 102 is positioned on each of phases A, B and C of the primary three-phase power source. For ease of illustration, only one winding represents the primary and secondary coils of first current transformer 102; however, one of ordinary skill in the art would understand that the single phase representation of FIG. 7 to represent three individual current transformer in a three-phase configuration, with primary coils and secondary coils. Each of the first current transformers 102 is connected to a corresponding second current transformer 104. Hence, first current transformer 102 on phase A is connected to second current transformer 104 for phase A; first current transformer 102 on phase B is connected to second current transformer 104 for phase B; first current transformer 102 on phase C is connected to second current transformer 104 for phase C. In this exemplary embodiment, each of the second current transformers 104 has two wires connected to device 101; other configurations can be performed by one of ordinary skill in the art.

Figure 8:
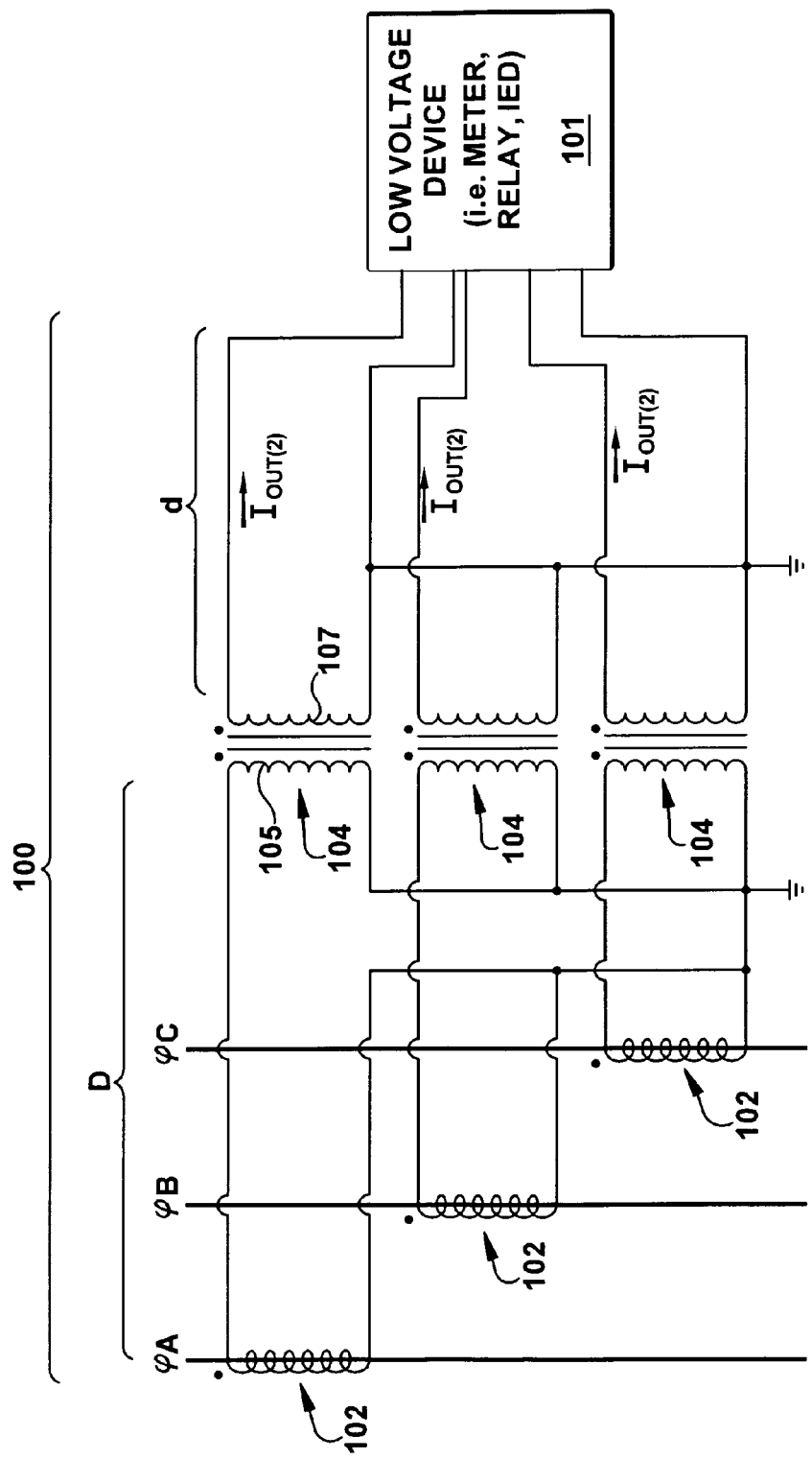
FIG. 8 illustrates another electrical schematic of a current sensing apparatus of one embodiment of the present invention with 4 low current output signals to the low voltage device, i.e. relay, connected to the current sensing apparatus.
Figure 10:
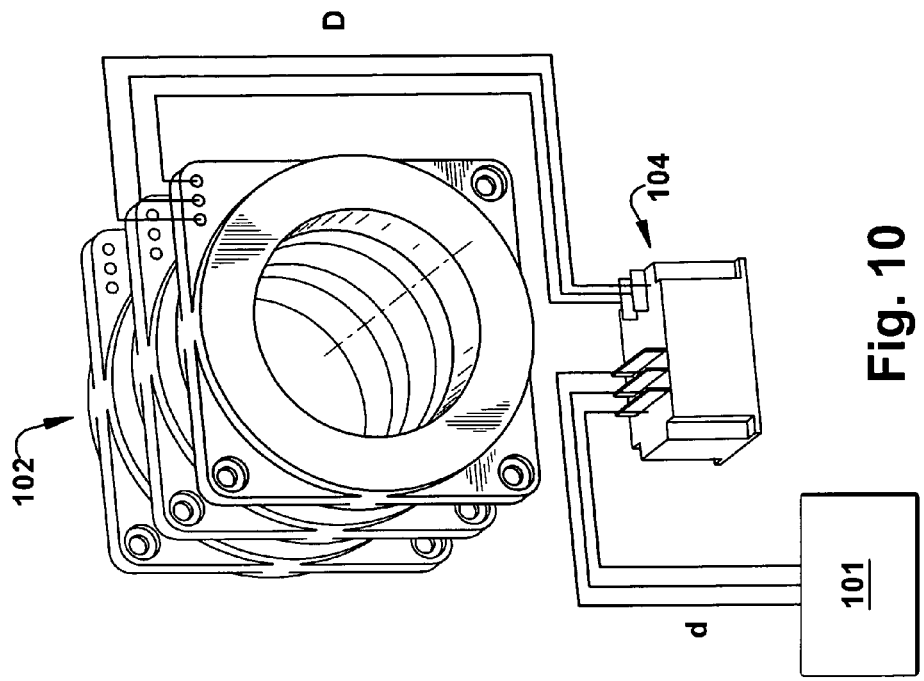
FIG. 10 illustrates a schematic block diagram of a prior art current sensing apparatus supplying current over a distance D+d to a device.

FIG. 8 illustrates another electrical schematic of a current sensing apparatus 100 of one embodiment of the present invention with 4 low current output signals $I_{out(2)}$ to the low voltage device, i.e. relay 101, connected to the current sensing apparatus 100; (φA, φB, φC) schematic of the current sensing apparatus 100 of the present invention. The 4 conductor connection is called a common ground connection. A first current sensing device 102 is positioned on each of phases A, B and C of the primary three-phase power source. Again, for ease of illustration, only one coil represents the primary and secondary windings of first current transformer 102; however, one of ordinary skill in the art would understand that the configuration is representative of a current transformer with primary windings and secondary windings. The 4 conductor common ground connection of FIG. 8 saves two wires, and decreases the impedance seen by the output current over distance d as compared to the impedance seen by the output current over distance d by the 6 conductor connection of FIG. 7; In the 4 conductor configuration, line losses are less than in the 6 conductor configuration of FIG. 7.

In both FIGS. 7 and 8, a dot is illustrated at each of the primary 105 and secondary 107 coils of the second current transformers 104. The dot indicates the relative winding configuration of the primary and secondary coils 105, 107 of second current transformer 104.

Returning to FIG. 4, primary current $I_{IN(1)}$, at utilization levels, is sensed by an induction current transformer or first current transformer 102 with enough windings or coils to yield a proportional secondary current signal $I_{out(1)}$ much smaller than the traditional 5A nominal level typically specified for low voltage products, such as products powered by the 5A signal. This smaller signal $I_{out(1)}$ is transmitted over a distance D of lengthy electric conductors much more efficiently than the traditional 5A signal. An example output current $I_{OUT(1)}$ from the first current transformer 102, is obtained from nominal primary phase current $I_{IN(1)}$ of 400A to 4000A, for example; the primary current transformation from the nominal phase current of substantially 400A to 4000A) is a secondary current $I_{OUT(1)}$ of 0.25 to 0.5A. This fractional secondary current $I_{OUT(1)}$ is then stepped up at the second current transformer to a traditional 1A or 5A, $I_{OUT(2)}$, prior to input to the device 101, i.e. IED, meter or relay.

Further, the increased numbers of turns (of the coil) in the current sensing devices provide a sufficient voltage level for the current to travel the distance D. At the input to the low voltage device, such as a meter or relay 101, the small signal $I_{out(1)}$ is passed into a second current transformer (and renamed $I_{in(2)}$). $I_{in(2)}$ is then transformed by the second current transformer 104 to a larger signal $I_{out(2)}$, typically a 5A signal that matches the 5A input rating of the low voltage device 101. An important factor is that the small signal $I_{out(2)}$ travels a comparatively short distance d, as compared to the distance D traveled by $I_{out(1)}$; the difference in current magnitude and distance traveled reduces the amount of line loss, which is a calculated using the equation $I^2R$ (power loss) over distance d. In the present invention, it is desired that the line loss be minimized or nominal and that the current input to the device 101 is sufficient to operate the device appropriately under various conditions including, steady state and fault conditions.

Figure 9:
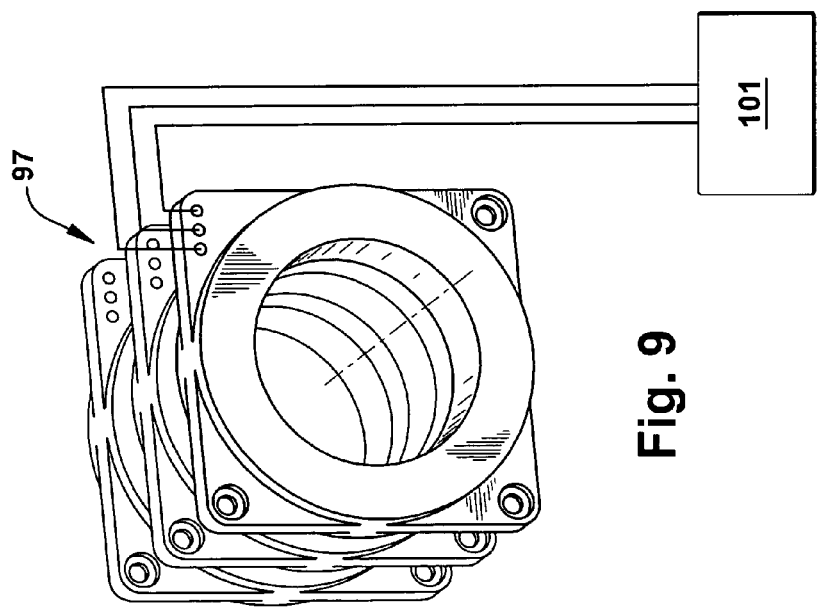
FIG. 9 illustrates a schematic block diagram of a prior art current sensing apparatus supplying current over a distance $D_{total}$ to a device.

The Current Sensing Apparatus 100 of the present invention is lighter than traditional current transformers 97 of FIG. 9. The smaller size, such as half depth first current transformers 102 (illustrated in FIG. 9) used in switchgear cabinets, decreases the costs for shipping and for mounting supports due to lighter weight of 33 lbs (as compared to prior art weight of 174 lbs) for 3-phases. The 174 lbs. refers to Model 785 current transformer and the 33 lbs. Refers to Model 778 manufactured by Instrument Transformers Inc., a division of GE Mutlin, a subsidiary of the assignee of the present invention. The Current Sensing Apparatus 100 comprises a smaller switchgear mounted first current transformer 102 such as a half-depth current transformer 102, for example ITI Model 778 (illustrated in FIG. 10). This first current transformer 102 is smaller than traditional current transformers 97 for previous current sensing apparatus 99 (illustrated in FIG. 1). Hence, the first current transformer 102 saves mounting space that is allocated to current sensing in, for example, switchgear design. It is easier to specify the Current Sensing Apparatus 100 than a traditional current transformer product (shown in FIG. 1 and FIG. 9 prior art) because the Current Sensing Apparatus 100 systems are specified to meet 0.3% accuracy specified in IEEE C57.13 for metering, and will operate up to 20 times nominal rating for short bursts for relay over-current sensing (over-current sensing being sensing of fault currents such as, for example, currents caused by line-to-line short circuits). Whereas time-consuming, tedious calculations and careful specification are required with traditional prior art products to insure performance that meets the IEEE C57.13 specification since the input current to the device 101 incurs line losses $I^2R$ (and travel over a long distance $D_{total}$ substantially equal to D+d and also since the larger current transformers 97 are subject to greater excitation and saturation losses.

As in all electrical systems there is line loss associated with current flow in conductor. The longer the conductor, the greater the losses. The current sensing apparatus 100 of the present invention, illustrated in FIG. 10, transmits a substantially accurate low level current signal from a step-down unit or first current transformer 102 to a second current transformer 104 or step-up unit over a distance D. The second current transformer delivers, for example, a substantially 5A output current (under normal operation) signal directly to the relay or meter over a distance d. The second current transformer 104 can be, for example a model 3VT460 which provides three current transformers for three phase connection and weighs about 12 pounds. The 3VT 460 is manufactured by Instrument Transformers Inc., a division of GE Mutlin, a subsidiary of the assignee of the present invention. The rating, size, weight can be determined by one of ordinary skill in the art. The 5A signal sees substantially small losses over the length d of the conductor, so the user does not need to specify burdens and relay class voltage that would be needed for the prior art current seen in FIG. 9, traveling over a distance of $D_{total}$.

A further understanding of the losses avoided by the current sensing apparatus 100 of the present invention is obtained by review of induction coil theory. Suppose that, for the sake of example, an actual power source 200 connected to the primary winding of the first current transformer 102 of FIG. 2 is constantly changing, providing an alternating current, and that the primary winding has a different number of loops than the secondary winding. The induced current and potential in the secondary winding is different than the current in the primary winding. Hence, for first and second current transformers 102, 104, the primary winding has $N_p$ turns and the secondary winding has $N_s$ turns. When a voltage supplied by the power source $V_p$, the induced voltage in the secondary is $V_s$. The equation for secondary voltage is:

$$V_s = (N_s/N_p)V_P \quad \text{Equation-1}$$

The equation for induced current is given by Equation 2.

$$I_s = (N_p/N_s)I_p \quad \text{Equation-2}$$

The Equations (1) and (2) are for ideal current transformers, not taking into account finite resistances of the conductors or edge effects or other losses. Other processes that may affect experimental results are self-induction (one end of the coil changes current before the other end and induces a current at that end), and magnetic materials in the core of the tube, which increases the magnetic field, but also soaks up energy in flipping all the dipoles and creating eddy currents, causing the secondary current and voltage to vary from the ideal.

Empirical data collected in one of several experiment sets, with respect to the current sensing apparatus 100 of the present invention, using several set-ups configured with various first current transformer models from the Model 785 current transformer specification provided preliminary results with cost savings in the range of 11% to 36%. Further, weight reduction of 63% to 84% were seen with the Model 785 current transformer. Accuracy and voltage were measured to verify performance of the apparatus for metering and relaying applications. Performance accuracy was within the ranges of the IEEE C57.13 specification for the class C current transformers devices 102, 104 that were tested. For example, the IEEE C57.13 specification requires that a transformer maintain 10% accuracy at 20 times over-current. Excitation curves for current transformers are available from manufacturers, additionally they can be plotted by one of ordinary skill in the art. A typical excitation curve plots excitation current verses excitation voltage of the current transformer, as it reaches saturation.

The current sensing apparatus 100 comprises two current transformers, a first current transformer 102 (step-down) and a second current transformer 104 (step-up). Hence the current sensing apparatus 100 is a reliable copper and steel (for example) solution for providing a substantially accurate current to the low voltage device 101 without the need for complicated calculations to compensate for losses (i.e. saturation, excitation, line losses). In relay applications the primary concern is how a current transformer will perform in over-current conditions. Specification IEEE C57.13 requires that a transformer maintain 10% accuracy at 20 times over-current, and a "C" class is assigned corresponding to the secondary terminal voltage that a current transformer (such as, first and second current transformers 102, 104) can deliver to meet this condition. For example, a class C200 current transformer (not shown) can deliver 200Vac, at the secondary terminals, at 20 times nominal current with no greater than 10% error. It should be noted that a class "T" current transformer (not shown) is assigned to wound primary current transformers because they have higher leakage flux.

One formula that is used to specify a proper current transformer using the calculations of the prior art is Formula 1.

$$V_{CT} \geq I_{OC} * (R_{WINDING} + R_{LEAD\ WIRE} + R_{BURDEN}) \quad \text{Formula-1}$$

In the equation (3), for example, voltage $V_{CT}$ developed by the current transformer must be greater than overcurrent $I_{OC}$ times the sum of all resistances in the secondary loop, which includes, for example the resistance of the winding, the lead wire and the burden (not shown) ($R_{WINDING} + R_{LEAD\ WIRE} + R_{BURDEN}$). At 20 times the 5A nominal current, $I_{OC}$ is 100A amps. R winding $R_{WINDING}$ might be as high as 2.0Ω (Ohms). $R_{BURDEN}$ might be <0.1Ω. But $R_{LEAD\ WIRE} + R_{LEAD\ WIRE}$ is unknown so when calculating to specify a relay class for a relay device such as device 101, the prior art tended to substantially over specify the relay class voltage. This over specification is costly.

With the current sensing apparatus 100, $I_{OC}$ is 10 amps from the first current transformer 102 (step-down unit) to the second current transformer 104 (step-up unit). Since power lost over the lead wire is almost purely resistive, then the line loss is a function of power loss calculated by the equation $I^2R$. This means that line loss is one-hundred time less with the current sensing apparatus 100 over the distance D. This is small enough that performance over a distance of 1 mile using #14AWG conductor is substantially reliable as has been seen in empirical testing.

The conclusion that can be implied from the above calculations and examples is that the current sensing apparatus 100 of the present invention is substantially reliable at $I_{OC}$ of 20 times the over-current operation. This is a great improvement over the prior art.

With respect to calculations performed in determining currents, losses, etc., for the present invention, Root-Mean-Square (rms) current sensing and peak-current sensing are typically used. Root-Mean-Square current sensing which is well known to one skilled in the art of current sensing, generally refers to an accurate method for calculating the energy associated with a sinusoidal current wave. Peak-current sensing is also well known to one skilled in the art of current sensing, generally refers to an accurate method for determining the occurrence of a peak current above a pre-defined threshold. Since different design considerations must be taken into account regarding circuit breaker 402, and device 101 applications, different types of data and current transformers may be used depending up on the current sensing application. These determinations can be made by one of ordinary skill in the art.

It is possible, alternately, to identify the present invention 100 as current transformer signal with basis shifting for the purpose of burden reduction and/or burden stabilization- and also, for example, power, size and weight reduction. A current transformer produces proportional current only if the transformer produces enough power to drive the current. Due to the advent of electronic relays, and meters and IEDs (i.e. devices 101) which can be used with current sensing apparatus 100, the low voltage devices 101 consume much less power than prior art devices. Hence power is primarily consumed in watts-loss in the current transformer (core and wire), and the conductor connecting the transformer to device 101. The power loss in the conductor is $I^2R$ as explained above, where I=current in the secondary conductor and R is the resistance of the conductor. For example, if the conductor resistance is 1Ω and the nominal secondary current is 5A, then the conductor will consume power equivalent to $I^2R = 5A * 5A * 1Ω$ which equals 25 watts. But if the nominal secondary current is a value much less than 5A, for example 0.5A in the same conductor, then the power loss of the conductor would drop to $I^2R = 0.5A * 0.5A * 1Ω$ which equals 0.25 watts.

The comparison of power loss in the above example is 25 watts as compared to 0.25 watts. This drastic reduction in transmission line (conductor) loss means that the largest burdens presented to the current transformer are the internal losses of the current transformer or first current transformer 102 and the step up transformer or second current transformer 104 located just adjacent to the meter or relay device 101. The step up transformer or second current transformer 104 may often consume as much power as the conductor run, but the conductor run losses are comparatively negligible for short or long runs. This means that the connected burden is very stable, i.e. it is almost independent of the connected conductor length. This offers three benefits: 1) the first current transformer 102 can be located further away from the relay or meter 101; 2) the second current transformer 104 can be smaller and lighter, and 3) A current transformer sensing system performance is substantially predictable due to the certain burden (despite uncertainties of conductor length or conductor gauge/size.

The apparatus of the present invention is different because of its ability to operate in a configuration where operating power is reduced, as compared to the prior art, due to materials specified, transmission loss reduction and lowering the uncertain burden losses to smaller magnitudes so that designs do not have to take into account the kinds conservative over-calculating typically employed to ensure that the relay, meter or IED device 101 has enough power to operate. Note also that due to the convention output current of the current sensing apparatus 100 to the device 101 traditional current transformer application rules apply so that the current sensing apparatus requires practically no re-education in the commercial market.

Although the above-summarized embodiments have been directed to a current sensing apparatus 100 comprising a first current transformer for stepping-down current connected to a second current transformer for stepping up current of at least a nominal rating of a connected device 101, those of ordinary skill in the art will understand that within the scope of the claimed invention, other applications include, but are not limited to, more than two cascaded current transformers connected to a device 101 for providing current of at least a nominal rating of a connected device 101. Additionally those of ordinary skill in the art will also under stand that within the scope of the claimed invention as current transformer signal with basis shifting for the purpose of burden reduction and/or burden stabilization- and also, for example, power, size and weight reduction. It would also be understood that the current sensing apparatus 100 could be used in circuits other than the several described herein, as may be determined by one of ordinary skill in the art.

The current sensing apparatus 100 is lighter than traditional CTs. This saves shipping and mounting support costs. The CSS is small that traditional CTs; this saves mounting space that must be allocated to current sensing. It is easier to specify the current sensing apparatus 100 than a traditional CT product because all current sensing apparatus 100 meets 0.3% accuracy per IEEE C57.13 for metering, and operates up to 20 times nominal rating for short bursts for relay over current sensing. Whereas calculations and careful specification must be done with traditional products to insure this performance.

With respect to the above description, it should be realized that the optimum dimensional relationships for the parts of the invention, to include variations in size, form function and manner of operation, assembly and use, are deemed readily apparent and obvious to those skilled in the art, and therefore, all relationships equivalent to those illustrated in the drawings and described in the specification are intended to be encompassed only by the scope of appended claims.

In addition, while the present invention has been shown in the drawings and fully described above with particularity and detail in connection with what is presently deemed to be practical and several of the preferred embodiments of the invention, it will be apparent to those of ordinary skill in the art that many modifications thereof may be made without departing from the principles and concepts set forth herein. Hence, the proper scope of the present invention should be determined only by the broadest interpretation of the appended claims so as to encompass all such modifications and equivalents.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A current sensing apparatus comprising:
   a first current transformer, the first current transformer, when energized, having a first input current and a first output current, the first output current being less than the first input current;
   a second current transformer in electrical communication with the first current transformer, the second current transformer, when energized, having a second input current and a second output current, wherein the second input current is substantially less than the first output current, the second output current being greater than the first output current; and
   wherein the second output current is substantially equal to a nominally rated input current of a low voltage device in electrical communication with the second current transformer.

2. The current sensing apparatus of claim 1 wherein the first current transformer is electrically connected to the second current transformer by a first conductor.

3. The current sensing apparatus of claim 2 wherein the second current transformer is electrically connected to the low voltage device by a second conductor.

4. The current sensing apparatus of claim 3 wherein a power loss in the first conductor is substantially greater than a power loss in the second conductor.

5. The current sensing apparatus of claim 1 wherein the first input current is provided to the first current transformer by a current flowing on a busbar.

6. The current sensing apparatus of claim 1 wherein the first current transformer comprises a primary coil, a secondary coil, and a first iron core.

7. The current sensing apparatus of claim 1 wherein the second current transformer comprises a first coil, a second coil, and a second iron core.

8. The current sensing apparatus of claim 1 wherein the second output current is about 5 amperes.

9. The current sensing apparatus of claim 1 further comprising a circuit breaker which opens if the second output current reaches a predetermined level.

10. A current sensing apparatus comprising:
    a plurality of feeders electrically connected to a power source;
    a plurality of first current transformers, each first current transformer, when energized, having a first input current provided by a feeder of the plurality of feeders and a first output current, the first output current being less than the first input current;

a plurality of second current transformers, each secondary current transformer in electrical communication with a first current transformer, each second current transformer, when energized, having a second input current and a second output current, wherein the second input current is substantially less than the first output current, the second output current being greater than the first output current; and wherein the second output current is substantially equal to a nominally rated input current of a low voltage device in electrical communication with the second current transformer.

11. The current sensing apparatus of claim 10 wherein each first current transformer is electrically connected to each second current transformer by a first conductor.

12. The current sensing apparatus of claim 11 wherein each second current transformer is electrically connected to the low voltage device by a second conductor.

13. The current sensing apparatus of claim 12 wherein a power loss in the first conductor is substantially greater than a power loss in the second conductor.

14. The current sensing apparatus of claim 10 further comprising a plurality of circuit breakers, each circuit breaker in electrical communication with the low voltage device, the circuit breaker opening if the second output current reaches a predetermined level thereby disconnecting a feeder from a power source.

15. The current sensing apparatus of claim 10 wherein each first current transformer comprises a primary coil, a secondary coil, and a first iron core.

16. The current sensing apparatus of claim 10 wherein each second current transformer comprises a first coil, a second coil, and a second iron core.

17. The current sensing apparatus of claim 10 wherein the second output current is about 5 amperes.

18. A current sensing apparatus comprising:

a plurality of first current transformers, each first current transformer, when energized, having a first input current provided by a feeder of the plurality of feeders and a first output current, the first output current being less than the first input current;

a plurality of second current transformers, each secondary current transformer in electrical communication with a first current transformer, each second current transformer, when energized, having a second input current and a second output current, wherein the second input current is substantially less than the first output current, the second output current being greater than the first output current;

a power source having a plurality of phases, wherein the first input current is provided to each first current transformer by a phase of the power source; and wherein the second output current is substantially equal to a nominally rated input current of a low voltage device in electrical communication with the second current transformer.

19. The current sensing apparatus of claim 18 wherein each first current transformer is electrically connected to each second current transformer by a first conductor.

20. The current sensing apparatus of claim 19 wherein each second current transformer is electrically connected to the low voltage device by a second conductor.

* * * * *